(12) United States Patent
Miller et al.

(10) Patent No.: US 6,459,049 B1
(45) Date of Patent: Oct. 1, 2002

(54) HIGH DENSITY SIGNAL ROUTING

(75) Inventors: Leah M. Miller, Fremont, CA (US); Farshad Ghahghahi, Los Gatos, CA (US); Edwin M. Fulcher, Palo Alto, CA (US); Aritharan Thurairajaratnam, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/885,299

(22) Filed: Jun. 20, 2001

(51) Int. Cl.$^7$ .................................................. H01R 9/09
(52) U.S. Cl. ........................ 174/261; 257/691; 361/777
(58) Field of Search .......................... 257/691; 361/794, 361/777; 428/901; 174/261, 262, 263

(56) References Cited

U.S. PATENT DOCUMENTS

| | | | | | |
|---|---|---|---|---|---|
| 4,551,747 | A | * | 11/1985 | Gilbert et al. | 257/691 |
| 6,204,826 | B1 | * | 3/2001 | Rutkowski et al. | 343/895 |
| 6,217,989 | B1 | * | 4/2001 | Brody et al. | 174/261 |
| 6,255,600 | B1 | * | 7/2001 | Schaper | 174/261 |

* cited by examiner

Primary Examiner—Albert W. Paladini

(74) Attorney, Agent, or Firm—Luedeka, Neely & Graham, P.C.

(57) ABSTRACT

A structure for receiving electrical signals near a central portion of the structure and distributing the electrical signals to a peripheral portion of the structure. The structure has a first set of contacts arranged in an array near the central portion of the structure. Electrically conductive traces connect the first set of contacts to a second set of contacts, where each of the electrically conductive traces has at least a first segment, a second segment, and a third segment. The first segment of each of the electrically conductive traces has relatively narrow width and spacing. The first segment of each of the electrically conductive traces is connected on a first end of the first segment to one of the first set of contacts and on a second end of the first segment to the second segment of each of the electrically conductive traces. The second segment of each of the electrically conductive traces has relatively intermediate width and spacing. The second segment of each of the electrically conductive traces is connected on a first end of the second segment to the second end of the first segment and on a second end of the second segment to the third segment of each of the electrically conductive traces. The third segment of each of the electrically conductive traces has relatively wide width and spacing. The third segment of each of the electrically conductive traces is connected on a first end of the third segment to the second end of the second segment and on a second end of the third segment to one of the second set of contacts.

16 Claims, 1 Drawing Sheet

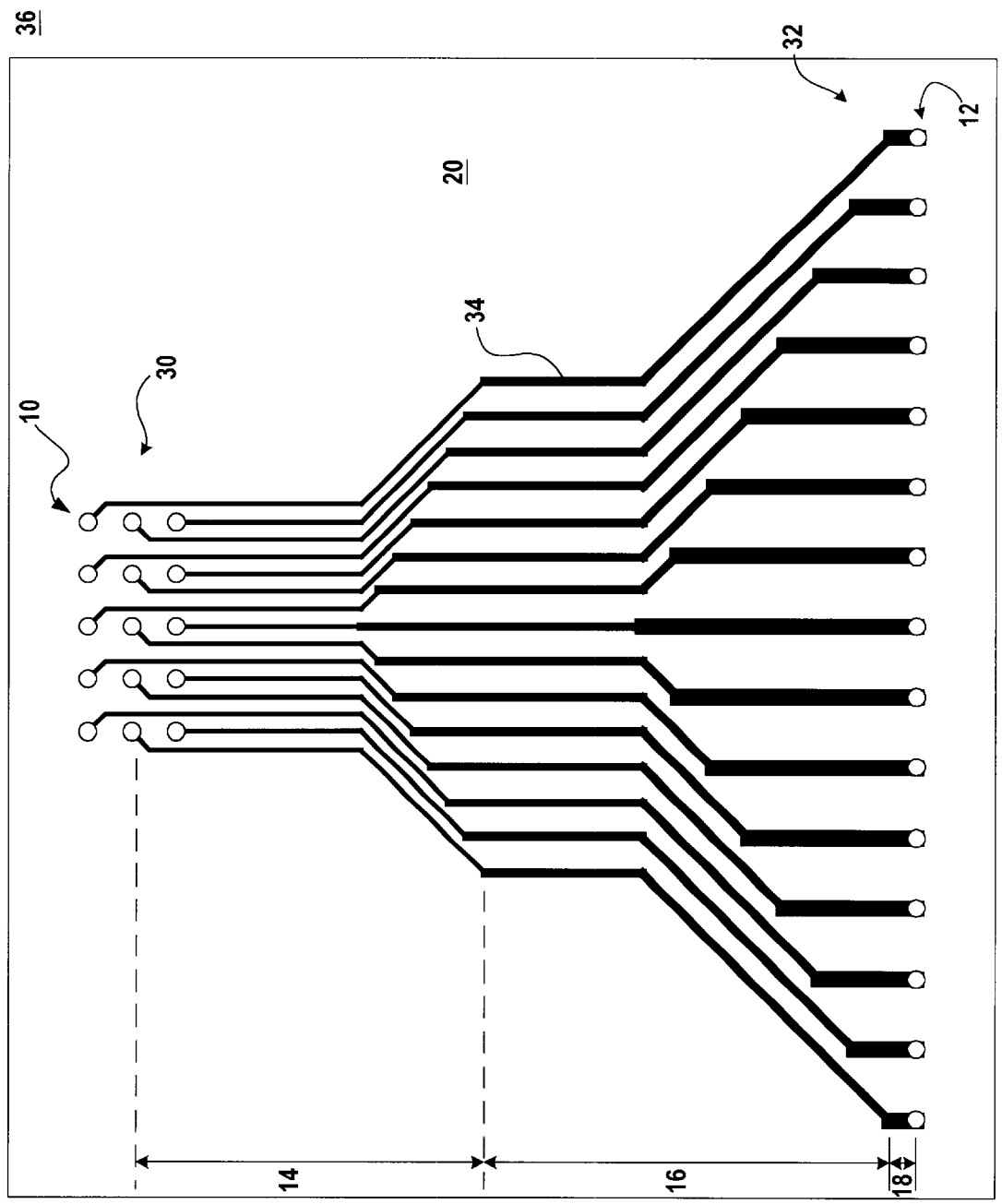

HIGH DENSITY SIGNAL ROUTING

FIELD

This invention relates to the field of microelectronic circuit fabrication. More particularly, this invention relates to routing signals with improved electrical performance and manufacturing yield.

BACKGROUND

As microelectronic devices get increasingly smaller, new problems with fabricating the devices emerge. For example, as the device sizes decrease, an increasingly greater number of contacts to the device need to be made within an increasingly smaller contact area. The number of contacts within a given surface area of an integrated circuit is generally referred to as the contact density. Obviously, as the contact density of the integrated circuit increases, so too will the contact density of the associated packaging for the integrated circuit tend to increase.

This situation of increasing contact density tends to create difficulties in providing the number of contacts required in a manner where the signal integrity through the contacts is maintained. Further, routing the signals through the contacts to the package presents additional challenges as the contact density increases. As the contacts become more tightly arranged, the cross-sectional area of the conductive materials through which the electrical signals are transmitted from the integrated circuit to the package is forced to become smaller. Since a conductor's impedance becomes higher as the conductor's cross-sectional area becomes smaller, the impedance of the conductive materials on the smallest integrated circuits can approach the upper design limits.

Also as integrated circuits become increasingly smaller, they become increasingly faster. When integrated circuits become faster, the electrical signals transmitted through the integrated circuit operate at a higher frequency. Higher frequency signals tend to increase the amount of cross talk between the signals and negatively affect the integrated circuits' electrical performance.

Finally, as more of the conductive materials within an integrated circuit are fabricated near the upper design limits for the cross-sectional area, discontinuities in the conductive materials tend to become more frequent. Increasingly frequent discontinuities tend to reduce manufacturing yields and increase costs.

What is needed, therefore, is an improved routing configuration for the conductors within an integrated circuit.

SUMMARY

The above and other needs are met by a structure for receiving electrical signals near a central portion of the structure and distributing the electrical signals to a peripheral portion of the structure. The structure has a first set of contacts arranged in an array near the central portion of the structure. Electrically conductive traces connect the first set of contacts to a second set of contacts, where each of the electrically conductive traces has at least a first segment, a second segment, and a third segment.

The first segment of each of the electrically conductive traces has relatively narrow width and spacing. The first segment of each of the electrically conductive traces is connected on a first end of the first segment to one of the first set of contacts and on a second end of the first segment to the second segment of each of the electrically conductive traces.

The second segment of each of the electrically conductive traces has relatively intermediate width and spacing. The second segment of each of the electrically conductive traces is connected on a first end of the second segment to the second end of the first segment and on a second end of the second segment to the third segment of each of the electrically conductive traces.

The third segment of each of the electrically conductive traces has relatively wide width and spacing. The third segment of each of the electrically conductive traces is connected on a first end of the third segment to the second end of the second segment and on a second end of the third segment to one of the second set of contacts.

Thus, by gradually increasing the width and thereby the cross-sectional area of the conductive material from a relatively small width near the central portion of the structure to a relatively large width near the peripheral portion of the structure, one is able to more easily route the tight geometries and the impedance of the conductive material is reduced. Additionally, the increased width provides conductive materials that are more resistant to discontinuities and breaks. As a result, fabrication tends to produce fewer defects, thus increasing manufacturing yields.

In one preferred embodiment of the structure, the structure is a circuit board. In this embodiment, the central portion of the circuit board receives a packaged integrated circuit. The electrical signals are then transferred between the circuit board and the packaged integrated circuit.

In another preferred embodiment of the structure, the structure is an integrated circuit package. The central portion of the integrated circuit package, in this embodiment, receives an integrated circuit. The electrical signals are then transferred between the integrated circuit package and the integrated circuit.

The electrically conductive traces may have more than three segments. Regardless of whether the electrically conductive traces have three or more segments, the segments generally gradually increase in width and spacing from the central portion of the structure to the peripheral portion of the structure.

BRIEF DESCRIPTION OF THE DRAWINGS

Further advantages of the invention are apparent by reference to the detailed description when considered in conjunction with the FIGURE. The FIGURE is a top plan view of a structure for receiving, transmitting, and distributing electrical signals between a first set of contacts in a central portion of the structure and a second set of contacts in a peripheral portion of the structure. The FIGURE has not been drawn to scale so that the details are more easily discernable.

DETAILED DESCRIPTION

Referring now to the FIGURE, there is depicted a structure 36 for receiving and distributing electrical signals according to a preferred embodiment of the present invention. The structure 36 depicts two sets of contacts, a first set of contacts 10 and a second set of contacts 12, and three segments, a first segment 14, a second segment 16, and a third segment 18 of each electrically conductive trace 34 disposed on a substrate 20. It is appreciated that the structure 36 as depicted in the FIGURE, and the elements as disposed on the structure 36, are representational. Thus, in an actual embodiment, there may be a far greater number of the elements as described than are depicted. Additionally, there may also be other elements that are desirable, which for the sake of clarity in explanation have not been depicted.

As depicted in the FIGURE, the first set of contacts 10 is preferably arranged in an array in a central portion 30 of the structure 36. The array of contacts 10 is most preferably relatively densely packed within the central portion 30 of the structure 36. The first set of contacts 10 is preferably disposed in this manner so as to be able to receive a smaller device, from which signals are received, and to which signals are sent through the contacts in the first set of contacts 10. Thus, in a most preferred embodiment, the spacing between the first set of contacts 10 is determined by the spacing of the contacts on the smaller device which is received in this central portion 30 of the structure 36. The densely packed nature of the array of the first set of contacts 10 tends to dictate that the spacing between the traces 34 that route out the array of the first set of contacts 10 is fairly narrow, or in other words, that there is not much space between the first set of contacts 10 in which to route the traces 34.

A second set of contacts 12 is arranged in a peripheral portion 32 of the structure. The second set of contacts 12 is preferably less densely packed than the first set of contacts 10. The peripheral portion 32 is defined as a portion of the structure 36 that is not the central portion 30 of the structure 36, but is not necessarily at the edge of the structure 36. Similarly, the contacts of the second set of contacts 12 are not necessarily contacts per se, but may be connections to other electrically conductive traces 34 that go to other portions of the structure 36, which in various embodiments is much larger and contains many more elements than that as relatively depicted in the FIGURE. Thus, it is appreciated that the simplified embodiment given in the FIGURE is for the purposes of example only, and that only those elements that aid an understanding of the invention have been depicted.

Each electrically conductive trace 34 depicted in the FIGURE connects one of the first set of contacts 10 to one of the second set of contacts 12. Each electrically conductive trace 34 is comprised of a first segment 14, a second segment 16 and a third segment 18. The first segment 14, the second segment 16, and the third segment 18 of each electrically conductive trace 34 preferably have different widths, and thereby differing cross-sectional areas. The first segment 14, the second segment 16, and the third segment 18 are all composed of electrically conductive material. In a preferred embodiment, the first segment 14, the second segment 16, and the third segment 18 are all composed of the same electrically conductive material.

The first segment 14, the second segment 16, and the third segment 18 are also connected so that electrical signals pass from one of the first set of contacts 10 through each segment of an electrically conductive trace 34 before arriving at one of the second set of contacts 12. An electrical signal arriving at the structure 36 at one of the first set of contacts 10 flows through the first segment 14 of an electrically conductive trace 34. Then the electrical signal flows from the first segment 14 through the second segment 16. Next, the electrical signal flows from the second segment 16 through the third segment 18. Finally, the electrical signal flows from the third segment 18 to one of the second set of contacts 12. Electrical signals also preferably flow in the reverse direction of the process described above. So, a signal entering the portion of the structure 36 as depicted at one of the second set of contacts 12 flows through the third segment 18, the second segment 16, and the first segment 14 until the signal is received at one of the first set of contacts 10. The signal is then preferably transferred to another element from the one of the first set of contacts 10 at which it is received. Thus, electrical signals are transferred between the first set of contacts 10 and the second set of contacts 12, and from each of the two sets of contacts 10 and 12 to other elements, which for the sake of clarity in explanation are not depicted.

The first segment 14 of each electrically conductive trace 34 is connected on a first end to one of the first set of contacts 10 and on a second end to the second segment 16 of the same electrically conductive trace 34. Preferably, the first segment 14 of each electrically conductive trace 34 has a relatively narrow width, where a relatively narrow width is defined as a width comparatively smaller than the relatively intermediate width of the second segment 16 and the relatively wide width of the third segment 18.

The first segment 14 of each electrically conductive trace 34 also preferably has a relatively narrow space separating the first segment 14 of that electrically conductive trace 34 from the first segment 14 of each adjacent electrically conductive trace 34. A relatively narrow space is defined as a space comparatively smaller than the relatively intermediate space of a second segment 16 and the relatively wide space of a third segment 18. Additionally, all of the first segments 14 within the structure 36 are preferably not the same length.

The relatively narrow width and spacing of the first segment 14 of the electrically conductive traces 34 is most preferably driven by the desire to space the first set of contacts 10 in a manner in which they can receive another, smaller device, which has similarly narrowly spaced contacts. Thus, the first segment 14 of the electrically conductive traces 34 are relatively narrow in width and spacing because there is not much space available on the structure 36 in which to dispose all of the electrically conductive traces 34 which are desired to route out the first set of contacts 10.

The second segment 16 of each electrically conductive trace 34 is connected on a first end to the first segment 14 of the same electrically conductive trace 34 and on a second end to the third segment 18 of the same electrically conductive trace 34. Preferably, the second segment 16 of each electrically conductive trace 34 has a relatively intermediate width. A relatively intermediate width is defined as a width comparatively larger than the relatively narrow width of a first segment 14 and a width comparatively smaller than the relatively wide width of a third segment 18.

The second segment 16 of each electrically conductive trace 34 also preferably has a relatively intermediate space separating the second segment 16 of that electrically conductive trace 34 from the second segment 16 of each adjacent electrically conductive trace 34. A relatively intermediate space is defined as a space comparatively larger than the relatively narrow space of a first segment 14 and comparatively smaller than the relatively wide space of a third segment 18. Additionally, all of the second segments 16 within the structure 36 are preferably not the same length.

The relatively intermediate width and spacing of the second segment 16 of the electrically conductive traces 34 is made possible by the electrically conductive traces 34 spreading out from the first set of contacts 10 that are preferably relatively densely packed to the second set of contacts 12 that are preferably less densely packed. Thus, as the electrically conductive traces 34 also spread out, there is more room available to widen and space the electrically conductive traces 34.

There are preferably two competing design goals in deciding how to use the additional space available. First, the width of the electrically conductive traces 34 can be made wider to reduce the impedance of the electrically conductive traces 34 as described above. Second, the spacing of the electrically conductive traces 34 can be made wider to reduce the cross talk between the electrically conductive traces 34, especially as they operate at higher frequencies. These competing design goals are preferably balanced according to the specific function for which the structure 36 is designed.

For example, if the structure 36 is to be used for higher frequency operation, and the impedance of the electrically conductive traces 34 is less of an issue, then the extra space available for the electrically conductive traces 34 may be used mostly for additional spacing between the electrically conductive traces 34 in the second segment 16 and the third segment 18, and a relatively lesser amount of the additional space available may be used for increasing the width of the electrically conductive traces 34.

However, in an alternate embodiment where the structure 36 is to be used for a lower frequency operation, or when the impedance of the electrically conductive traces 34 is determined to be a greater issue than cross talk between the electrically conductive traces 34, then the extra space available for the electrically conductive traces 34 may be used mostly for increasing the width of the electrically conductive traces 34 in the second segment 16 and the third segment 18, and a relatively lesser amount of the additional space available may be used for additional spacing between the electrically conductive traces 34.

Thus, the amount of extra space available on the substrate 20 of the structure 36 in the second segment 16 and the third segment 18 is preferably balanced between additional width of the electrically conductive traces 34 and additional spacing between the electrically conductive traces 34, depending at least in part upon the specific use for which the structure 36 is designed.

The third segment 18 of each electrically conductive trace 34 is connected on a first end to the second segment 16 of the same electrically conductive trace 34 and on a second end to one of the second set of contacts 12. Preferably, the third segment 18 of each electrically conductive trace 34 has a relatively wide width, where a relatively wide width is defined as a width comparatively larger than the relatively narrow width of a first segment 14 and the relatively intermediate width of a second segment 16.

The third segment 18 of each electrically conductive trace 34 also has a relatively wide space separating the third segment 18 of that electrically conductive trace 34 from the third segment 18 of each adjacent electrically conductive trace 34. A relatively wide space is defined as a space comparatively larger than the relatively narrow space of a first segment 14 and the relatively intermediate space of a second segment 16. Additionally, all of the third segments 18 within the structure 36 are preferably not the same length.

It is appreciated that, in one preferred embodiment, the structure 36 is a circuit board where the central portion 30 receives a packaged integrated circuit. The invention is equally applicable, in another preferred embodiment, where the structure 36 is an integrated circuit package that receives an integrated circuit in the central portion 30 of the integrated circuit package.

Additionally, it is appreciated that the invention is equally applicable in the preferred embodiment of the structure 36 where the electrically conductive traces 34 are comprised of more than three segments, or preferably no less than two segments. In the preferred embodiment where the electrically conductive traces are comprised of more than three segments, the segments preferably gradually increase in width and spacing from the central portion 30 of the structure 36 to the peripheral portion 32 of the structure 36.

Preferably, the relatively narrow width of a first segment 14 of an electrically conductive trace 34 can vary within the low end of the manufacturing limits of the device. Preferably, the relatively narrow spacing that separates a first segment 14 of an electrically conductive trace 34 from the first segment 14 of each adjacent electrically conductive trace 34 can vary within the low end of the manufacturing limits of the device.

Preferably, the relatively intermediate width of a second segment 16 of an electrically conductive trace 34 can vary within the mid-range of the manufacturing limits of the device. Preferably, the relatively intermediate spacing that separates a second segment 16 of an electrically conductive trace 34 from the second segment 16 of each adjacent electrically conductive trace 34 can vary within the mid-range of the manufacturing limits of the device.

Preferably, the relatively wide width of a third segment 18 of an electrically conductive trace 34 can vary within the upper end of the manufacturing limits of the device. Preferably, the relatively wide spacing that separates a third segment 18 of an electrically conductive trace 34 from the third segment 18 of each adjacent electrically conductive trace 34 can vary within the upper end of the manufacturing limits of the device.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A circuit board for receiving electrical data signals near a central portion of the circuit board that receives a packaged integrated circuit, and the electrical signals are transferred between a peripheral portion of the circuit board and the packaged integrated circuit:

a first set of contacts arranged in an array in the central portion of the circuit board, a second set of contacts in the peripheral portion of the circuit board, and electrically conductive traces connecting the first set of contacts to the second set of contacts, wherein each of the electrically conductive traces has at least a first segment, a second segment, and a third segment, the first segment of each of the electrically conductive traces having a relatively narrow width and spacing and connected to one of the first set of contacts on a first end of the first segment and to the second segment of each of the electrically conductive traces on a second end of the first segment, the second segment of each of the electrically conductive traces having a relatively intermediate width and spacing and connected to the second end of the first segment of each of the electrically conductive traces on a first end of the second segment and to the third segment of each of the electrically conductive traces on a second end of the second segment, and the third segment of each of the electrically conductive traces having a relatively wide width and spacing and connected to the second end of the second segment of each of the electrically conductive traces on a first end of the third segment and to one of the second set of contacts on a second end of the third segment.

2. The circuit board of claim 1, wherein the electrically conductive traces have more than three segments, where the segments generally gradually increase in width and spacing from the central portion of the circuit board to the peripheral portion of the circuit board.

3. The circuit board of claim 1, wherein the relatively narrow width is within a low end of manufacturing limits for the circuit board.

4. The circuit board of claim 1, wherein the relatively narrow spacing is within a low end of manufacturing limits for the circuit board.

5. The circuit board of claim 1, wherein the relatively intermediate width is within a mid-range of manufacturing limits for the circuit board.

6. The circuit board of claim 1, wherein the relatively intermediate spacing is within a mid-range of manufacturing limits for the circuit board.

7. The circuit board of claim 1, wherein the relatively wide width is within a high end of manufacturing limits for the circuit board.

8. The circuit board of claim 1, wherein the relatively wide spacing is within a high end of manufacturing limits for the circuit board.

9. An integrated circuit package for receiving electrical data signals near a central portion of the integrated circuit package that receives an integrated circuit, and the electrical signals are transferred between a peripheral portion of the integrated circuit package and the integrated circuit:

a first set of contacts arranged in an array in the central portion of the integrated circuit package, a second set of contacts in the peripheral portion of the integrated circuit package, and electrically conductive traces connecting the first set of contacts to the second set of contacts, wherein each of the electrically conductive traces has at least a first segment, a second segment, and a third segment, the first segment of each of the electrically conductive traces having a relatively narrow width and spacing and connected to one of the first set of contacts on a first end of the first segment and to the second segment of each of the electrically conductive traces on a second end of the first segment, the second segment of each of the electrically conductive traces having a relatively intermediate width and spacing and connected to the second end of the first segment of each of the electrically conductive traces on a first end of the second segment and to the third segment of each of the electrically conductive traces on a second end of the second segment, and the third segment of each of the electrically conductive traces having a relatively wide width and spacing and connected to the second end of the second segment of each of the electrically conductive traces on a first end of the third segment and to one of the second set of contacts on a second end of the third segment.

10. The integrated circuit package of claim 9, wherein the electrically conductive traces have more than three segments, where the segments generally gradually increase in width and spacing from the central portion of the integrated circuit package to the peripheral portion of the integrated circuit package.

11. The integrated circuit package of claim 9, wherein the relatively narrow width is within a low end of manufacturing limits for the integrated circuit package.

12. The integrated circuit package of claim 9, wherein the relatively narrow spacing is within a low end of manufacturing limits for the integrated circuit package.

13. The integrated circuit package of claim 9, wherein the relatively intermediate width is within a mid-range of manufacturing limits for the integrated circuit package.

14. The integrated circuit package of claim 9, wherein the relatively intermediate spacing is within a mid-range of manufacturing limits for the integrated circuit package.

15. The integrated circuit package of claim 9, wherein the relatively wide width is within a high end of manufacturing limits for the integrated circuit package.

16. The integrated circuit package of claim 9, wherein the relatively wide spacing is within a high end of manufacturing limits for the integrated circuit package.

* * * * *